(12) United States Patent
Chia et al.

(10) Patent No.: US 6,489,571 B1
(45) Date of Patent: Dec. 3, 2002

(54) MOLDED TAPE BALL GRID ARRAY PACKAGE

(75) Inventors: Chok J. Chia; Qwai H. Low, both of Cupertino; Patrick Variot, Los Gatos, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 38 days.

(21) Appl. No.: 09/703,199

(22) Filed: Oct. 31, 2000

(51) Int. Cl.[7] ................................................ H05K 1/09
(52) U.S. Cl. ........................ 174/258; 174/261; 257/737; 257/738; 361/767; 361/768
(58) Field of Search ................................. 174/262, 261, 174/263–266, 258; 361/767–772, 760; 257/738, 737, 778, 787, 788; 438/126, 127

(56) References Cited

U.S. PATENT DOCUMENTS

| | | | | | |
|---|---|---|---|---|---|
| 5,901,041 | A | * | 5/1999 | Davies et al. | 361/772 |
| 6,031,292 | A | * | 2/2000 | Murakami et al. | 257/737 |
| 6,245,598 | B1 | * | 6/2001 | Chen et al. | 438/126 |
| 6,291,274 | B1 | * | 9/2001 | Oida et al. | 438/127 |

* cited by examiner

*Primary Examiner*—Albert W. Paladini
(74) *Attorney, Agent, or Firm*—Fitch, Even, Tabin & Flannery

(57) ABSTRACT

A molded tape ball grid array package includes a molding compound and a tape substrate having a top surface for mounting a die thereon, a bottom surface for attaching solder balls, and vias for forming connections between the solder balls and the die wherein the molding compound surrounds the die and the tape substrate.

8 Claims, 2 Drawing Sheets

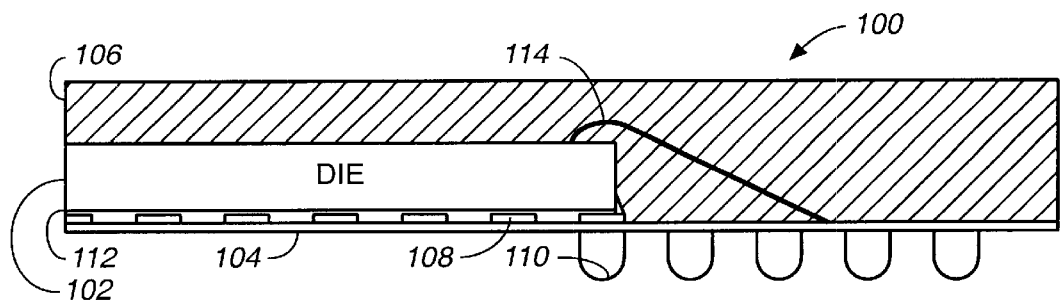
FIG._1
*(PRIOR ART)*
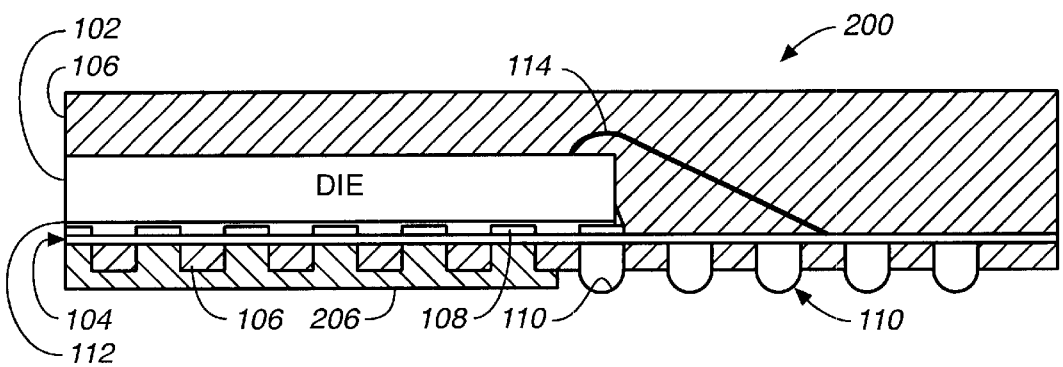
FIG._2
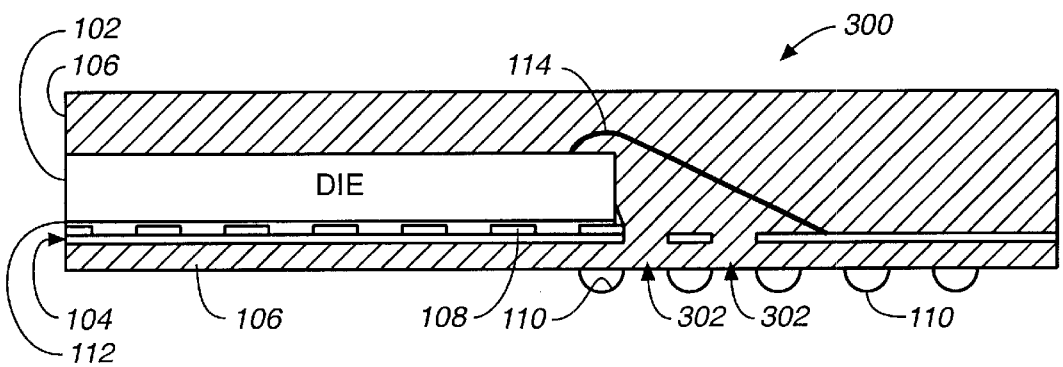
FIG._3

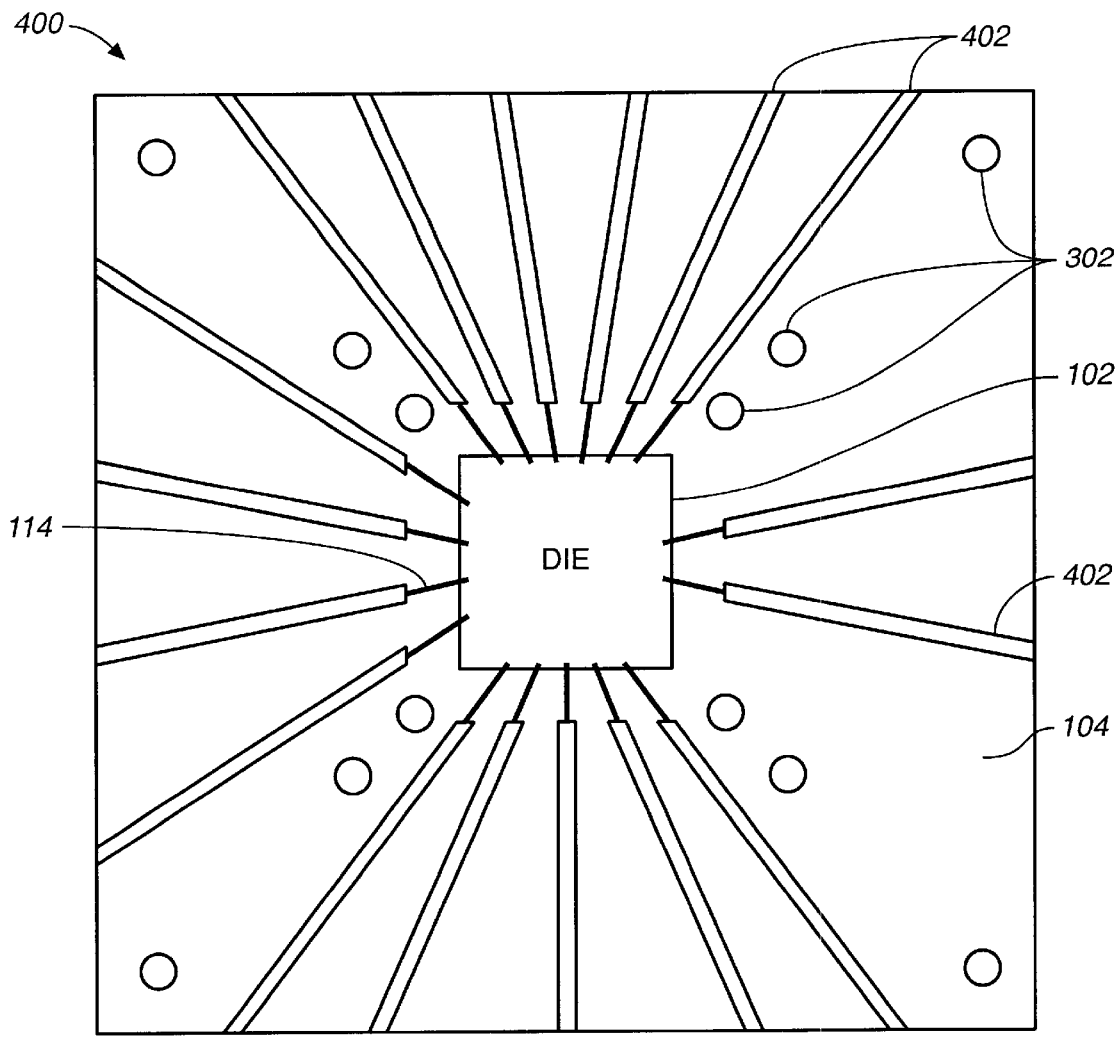
FIG._4

MOLDED TAPE BALL GRID ARRAY PACKAGE

BACKGROUND OF THE INVENTION

The present invention relates generally to integrated circuit packaging methods for flip chip ball grid arrays. More specifically, but without limitation thereto, the present invention relates to encapsulating a ball grid array tape and a semiconductor device in a molding compound to protect the die during processing.

Tape flip chip ball grid array packages use a metallized tape as a substrate. The die or chip is mounted on the top surface of the metallized tape, and solder balls are attached to the bottom surface of the tape. The metallized tape substrate provides interconnections between the die and the solder balls. A molding compound such as epoxy surrounds the die on the top and sides to fasten the die to the tape and to protect the die from contaminants during processing. Disadvantageously, the bottom of the die is not covered by the mold compound and is therefore exposed to contaminants that may cause the chip to fail. Also, the tape may absorb moisture, causing the die to delaminate from the tape.

SUMMARY OF THE INVENTION

The present invention advantageously addresses the problems above as well as other problems by providing a molded tape ball grid array package that completely encapsulates the die and the tape substrate.

In one embodiment, the present invention may be characterized as a molded tape ball grid array package that includes a molding compound and a tape substrate having a top surface for mounting a die thereon, a bottom surface for attaching solder balls, and vias for forming connections between the solder balls and the die wherein the molding compound entirely encapsulates the die and the tape substrate.

In another embodiment, the invention may be characterized as a method of making a molded tape ball grid array package comprising the steps of mounting a die on a top surface of a tape substrate, encapsulating the die and the tape substrate with a molding compound, and attaching solder balls to a bottom surface of the tape substrate.

BRIEF DESCRIPTION OF THE DRAWINGS

The above and other aspects, features and advantages of the present invention will be more apparent from the following more specific description thereof, presented in conjunction with the following drawings wherein:

FIG. 1 is a cross-section diagram of a molded tape package of the prior art;

FIG. 2 is a cross-section diagram of a molded tape package completely encapsulated by the molding compound according to an embodiment of the present invention;

FIG. 3 is a cross-section diagram of the molded tape package of FIG. 2 showing holes and slots in the tape substrate for introducing the molding compound; and FIG. 4 is a top view diagram of the molded tape package of FIG. 2.

Corresponding reference characters indicate corresponding elements throughout the several views of the drawings.

DETAILED DESCRIPTION OF THE DRAWING

The following description is presented to disclose the currently known best mode for making and using the present invention. The scope of the invention is defined by the claims.

FIG. 1 is a cross-section diagram of a molded tape package 100 of the prior art. Shown in FIG. 1 are a die 102, a tape substrate 104, a molding compound 106, contact pads 108, solder balls 110, die attach epoxy 112, and a wire bond 114.

The die 102 is mounted on a top surface of the tape substrate 104 and covered by the molding compound 106 to hold the die 102 in place over the contact pads 108 during the attachment of solder balls 110. The tape substrate 104 is typically a metallized tape that provides interconnections between the die 102 and the contact pads 108. The molding compound 106 is typically an epoxy. After the die 102 is covered with the molding compound 106, the molding compound 106 is cured to fix the die 102 on the tape substrate 104. The solder balls 110 are then attached to the bottom of the tape substrate 104 below the contact pads 108.

FIG. 2 is a cross-section diagram of a molded tape package 200 completely encapsulated by the molding compound 106. This arrangement differs from the molded tape package 100 of FIG. 1 in that the molding compound 106 flows and covers the bottom surface of the tape substrate 104, except for the locations below the contact pads 108 where the solder balls 110 are attached. During the encapsulation process, a molding die 206 contacts the lower surface of the tape substrate 104 to keep the molding compound out of the locations where solder balls 110 are to be attached.

FIG. 3 is a cross-section diagram 300 of the molded tape package of FIG. 2 showing holes and slots 302 in the tape substrate 104 for introducing the molding compound 106.

FIG. 4 is a top view diagram 400 of the molded tape package of FIG. 2. The holes and slots 302 are formed as shown between metal traces 402 and the bond wires 114 to allow the molding compound 106 to flow underneath the tape substrate 104. After the molding compound 106 has cured, the molding die 206 is removed, and the solder balls 110 are attached in the usual manner. Because the die 102 and the tape substrate 104 are completely encapsulated by the molding compound 106, both the die 102 and the tape substrate 104 are protected from exposure to moisture and other contaminants during processing. Also, the molding compound 106 surrounding the tape substrate 104 strengthens the bond between the die 102 and the tape substrate 104 to provide greater resistance to delaminating during processing than adhesion of the molding compound 106 to the top of the tape substrate 104 alone used in the arrangement of FIG. 1.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A molded tape ball grid array package comprising:
   a tape substrate having a top surface and a bottom surface;
   a die mounted on the top surface of the tape substrate;
   a plurality of solder balls attached to the bottom surface of the tape substrate; and
   a molding compound completely encapsulating the die and the tape substrate except in locations where the solder balls are attached so that the die and the tape substrate are protected from exposure to moisture and contaminants.

2. The molded tape ball grid array package of claim 1 wherein the tape substrate is a metallized tape.

3. The molded tape ball grid array package of claim 1 wherein the molding compound is an epoxy.

4. The molded tape ball grid array package of claim 1 wherein the tape substrate has openings for introducing the molding compound underneath the tape substrate.

5. A method of making a molded tape ball grid array package comprising the steps of:

mounting a die on a top surface of a tape substrate;

completely encapsulating the die and the tape substrate with a molding compound except in locations where solder balls are to be attached to protect the die and the tape substrate from exposure to moisture and contaminants; and attaching solder balls to a bottom surface of the tape substrate in the locations where solder balls are to be attached.

6. The method of claim 5 wherein the tape substrate is a metallized tape.

7. The method of claim 5 wherein the molding compound is an epoxy.

8. The method of claim 5 wherein the tape substrate has openings for introducing the molding compound underneath the tape substrate.

* * * * *